(12) United States Patent
Tu

(10) Patent No.: US 10,908,211 B2
(45) Date of Patent: Feb. 2, 2021

(54) INTEGRATED CIRCUIT AND DETECTION METHOD FOR MULTI-CHIP STATUS THEREOF

(71) Applicant: Winbond Electronics Corp., Taichung (TW)

(72) Inventor: Ying-Te Tu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 161 days.

(21) Appl. No.: 16/296,124

(22) Filed: Mar. 7, 2019

(65) Prior Publication Data

US 2020/0284836 A1 Sep. 10, 2020

(51) Int. Cl.
*G01R 31/28* (2006.01)
*H01L 25/065* (2006.01)
*G11C 11/4074* (2006.01)

(52) U.S. Cl.
CPC ...... *G01R 31/2896* (2013.01); *H01L 25/0657* (2013.01); *G11C 11/4074* (2013.01); *H01L 2225/0651* (2013.01); *H01L 2225/06596* (2013.01)

(58) Field of Classification Search
CPC ....... H01L 25/0657; H01L 2225/06596; G11C 11/4074
See application file for complete search history.

(56) References Cited

U.S. PATENT DOCUMENTS

| 8,902,680 | B2 | 12/2014 | Yamamoto | |
|---|---|---|---|---|
| 9,305,905 | B2 | 4/2016 | Tanadi | |
| 9,478,502 | B2 | 10/2016 | Satoh | |
| 2003/0021139 | A1* | 1/2003 | Nakamura | G11C 7/1063 365/63 |
| 2013/0326090 | A1* | 12/2013 | Gillingham | G06F 13/1684 710/5 |
| 2014/0310574 | A1* | 10/2014 | Yu | G11C 29/72 714/773 |

FOREIGN PATENT DOCUMENTS

| TW | 200822135 | 5/2008 |
|---|---|---|
| TW | M368188 | 11/2009 |
| TW | 201123191 | 7/2011 |
| TW | 201237880 | 9/2012 |

OTHER PUBLICATIONS

"Office Action of Taiwan Counterpart Application," dated May 28, 2019, p. 1-p. 5.

* cited by examiner

*Primary Examiner* — Alvaro E Fortich
(74) *Attorney, Agent, or Firm* — JCIPRNET

(57) ABSTRACT

An integrated circuit and a detection method for multi-chip status thereof are provided. The integrated circuit includes at least one chip. The at least one chip has a stack status pin and a busy pin. The at least one chip applies a bias voltage on the busy pin according to a voltage status of the stack status pin. The at least one chip further detects an indication voltage on the busy pin, and decides whether a number of the at least chip is plural according to the indication voltage on the busy pin.

15 Claims, 4 Drawing Sheets

INTEGRATED CIRCUIT AND DETECTION METHOD FOR MULTI-CHIP STATUS THEREOF

BACKGROUND

Technical Field

The invention relates to an integrated circuit, and particularly relates to an integrated circuit and a detection method for multi-chip status thereof.

Description of Related Art

Along with development of packaging technology and increasing difficulty in process miniaturization, the pursuit of high-density memory space and multi-chip stacked packaging technology becomes another low-cost option. However, in order to enable each independent chip to recognize its position in the stack of the stacked chips, multiple pins have to be configured, and by connecting these pins to different voltage levels according to the positions of each of the chips, the position of each chip may be identified. However, in order to respectively connect the pins of the chips to the correct voltage levels, material cost of required metal wires is non-negligible. Therefore, under the condition of low-cost demand, it is possible to only connect only a part of the pins to a single specific level to save the cost of the metal wires corresponding to the other part of the pins.

Under the above framework, in the conventional technique, a stack status pin corresponding to the chip of a first layer has a floating status. Therefore, the chip of the first layer cannot get to obtain whether the associated integrated circuit only has a single chip, or it is one of a plurality of chips stacked with each other. In this case, the chip of the first layer cannot effectively address a memory block therein, resulting in difficulty in operation.

SUMMARY

The invention is directed to an integrated circuit and a detection method for multi-chip status thereof, which are adapted to effectively detect whether the number of chips included in the integrated circuit is plural.

The invention provides an integrated circuit including at least one chip, the at least one chip has a stack status pin and a busy pin. The at least one chip applies a bias voltage on the busy pin according to a voltage status of the stack status pin. The at least one chip further detects an indication voltage on the busy pin, and determines whether the number of the at least chip is plural according to the indication voltage on the busy pin.

The invention provides a detection method for multi-chip status including following steps: configuring a stack status pin and a busy pin in at least one chip, and applying a bias voltage on the busy pin according to a voltage status of the stack status pin; detecting an indication voltage on the busy pin by the at least one chip, and determining whether the number of the at least chip is plural according to the indication voltage on the busy pin.

According to the above description, the at least one chip of the integrated circuit provides the bias voltage on the busy pin of the at least one chip according to the voltage status of the stack status pin thereof. Moreover, by detecting the indication voltage on the busy pin, it is determined whether the number of the at least one chip included in the integrated circuit is plural, so as to execute corresponding operations.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
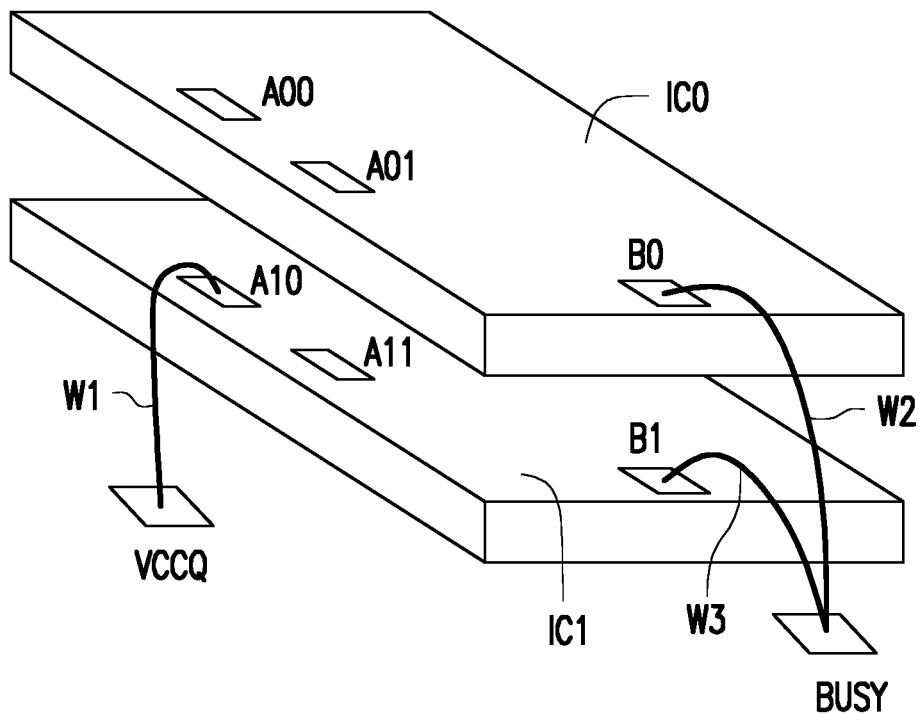
FIG. 1 is a schematic diagram of an integrated circuit according to an embodiment of the invention.

FIG. 1 is a schematic diagram of an integrated circuit according to an embodiment of the invention. The integrated circuit 100 includes chips IC0 and IC1 stacked with each other. The chip IC0 has a stack status pin (including sub-pins A00 and A01) and a busy pin B0. The chip IC1 has a stack status pin (including sub-pins A10 and A11) and a busy pin B1. In the integrated circuit 100, the chip IC0 is a first chip, so that the sub-pins A00 and A01 on the chip IC0 are kept in a floating status, and are not connected to any voltage level. On the other hand, the chip IC1 is not the first chip, and at least one of the sub-pins A10 and A11 on the chip IC1 is in a non-floating status, and the sub-pin A10 on the chip IC1 is connected to a reference voltage VCCQ through a wire W1.

The busy pin B0 of the chip IC0 is used for transmitting a signal indicating whether the chip IC0 is busy under a normal operation status. For example, the chip IC0 is a Dynamic Random Access Memory (DRAM) chip, when the chip IC0 is in the normal operation status, and a refreshing operation or a programming operation of memory cells is executing therein, the chip IC0 may transmit information related to the situation that the chip IC0 is busy and cannot implement a reading operation through the busy pin B0. It should be noted that when the chip IC0 just completes booting and enters an initial status setting time section, the busy pin B0 is not used for indicating whether the chip IC0 is busy for the chip IC0.

In the embodiment of the invention, the busy pins B0 and B1 of the chips IC0 and IC1 are respectively and commonly connected to a pad PD1 through wires W2 and W3, and an indication voltage BUSY is generated on the pad PD1. It should be noted that the indication voltage BUSY may be generated during the aforementioned initial status setting time section.

It should be noted that the pad PD1 may be formed at any part of a packaging carrier of the integrated circuit 100, which is not limited by the invention.

To be specific, based on the situation that the voltage statuses of the sub-pins A00 and A01 of the chip IC0 are all the floating status, the chip IC0 may first temporarily or continuously exert a first bias voltage on the busy pin B0. Based on the situation that the voltage statuses of the sub-pins A10 and A11 of the chip IC0 are respectively the non-floating status (equal to the reference voltage VCCQ) and the floating status, the chip IC1 may continuously exert a second bias voltage on the busy pin B1. A voltage value of the first bias voltage may be smaller than a voltage value of the second bias voltage. Under the condition that driving capability of the first bias voltage provided by the chip IC0 is smaller than driving capability of the second bias voltage provided by the chip IC1, the indication voltage BUSY may be between the aforementioned second bias voltage and the first bias voltage, and is close to the voltage value of the second bias voltage. In this way, by determining that the voltage value of the indication voltage BUSY is not the voltage value of the first bias voltage exerted by the chip IC0, the chip IC0 may obtain that the integrated circuit 100 has a plurality of mutually stacked chips. By determining that the voltage statuses of the sub-pins A10 and A11 are respectively the non-floating status (equal to the reference voltage VCCQ) and the floating status, the chip IC1 may also obtain that the integrated circuit 100 has a plurality of mutually stacked chips.

Figure 2:
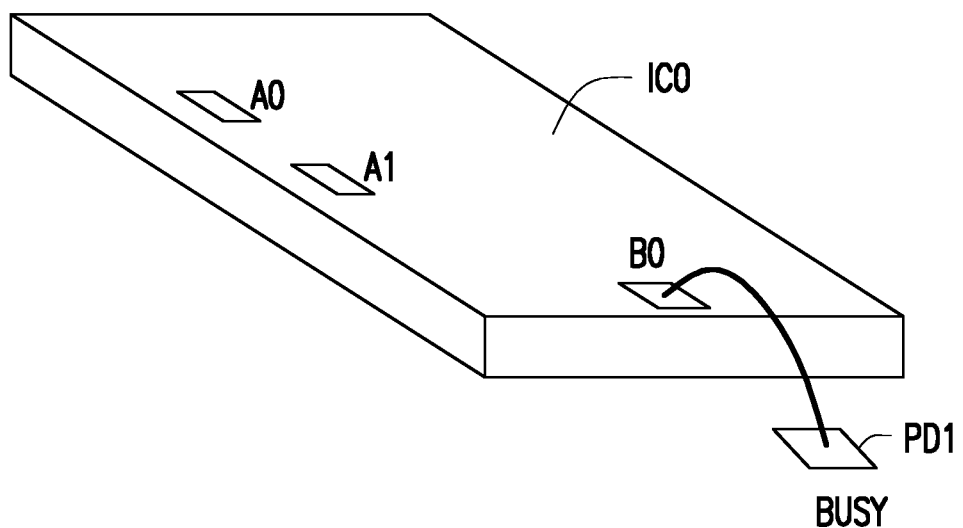
FIG. 2 is a schematic diagram of an integrated circuit according to another embodiment of the invention.

FIG. 2 is a schematic diagram of an integrated circuit according to another embodiment of the invention. The integrated circuit 200 includes a chip IC0. The chip IC0 has the stack status pin (including the sub-pins A00 and A01) and the busy pin B0. The chip IC0 may first temporarily or continuously exert a first bias voltage on the busy pin B0 according to the sub-pins A00 and A01 in the floating status during the initial status setting time section, and under the condition that none other chip pulls the indication voltage BUSY on the pad PD1, the voltage value of the indication voltage BUSY is substantially equal to the voltage value of the first bias voltage. In this way, by determining the voltage value of the indication voltage BUSY, it is known that the integrated circuit 200 only has a single chip.

Figure 3:
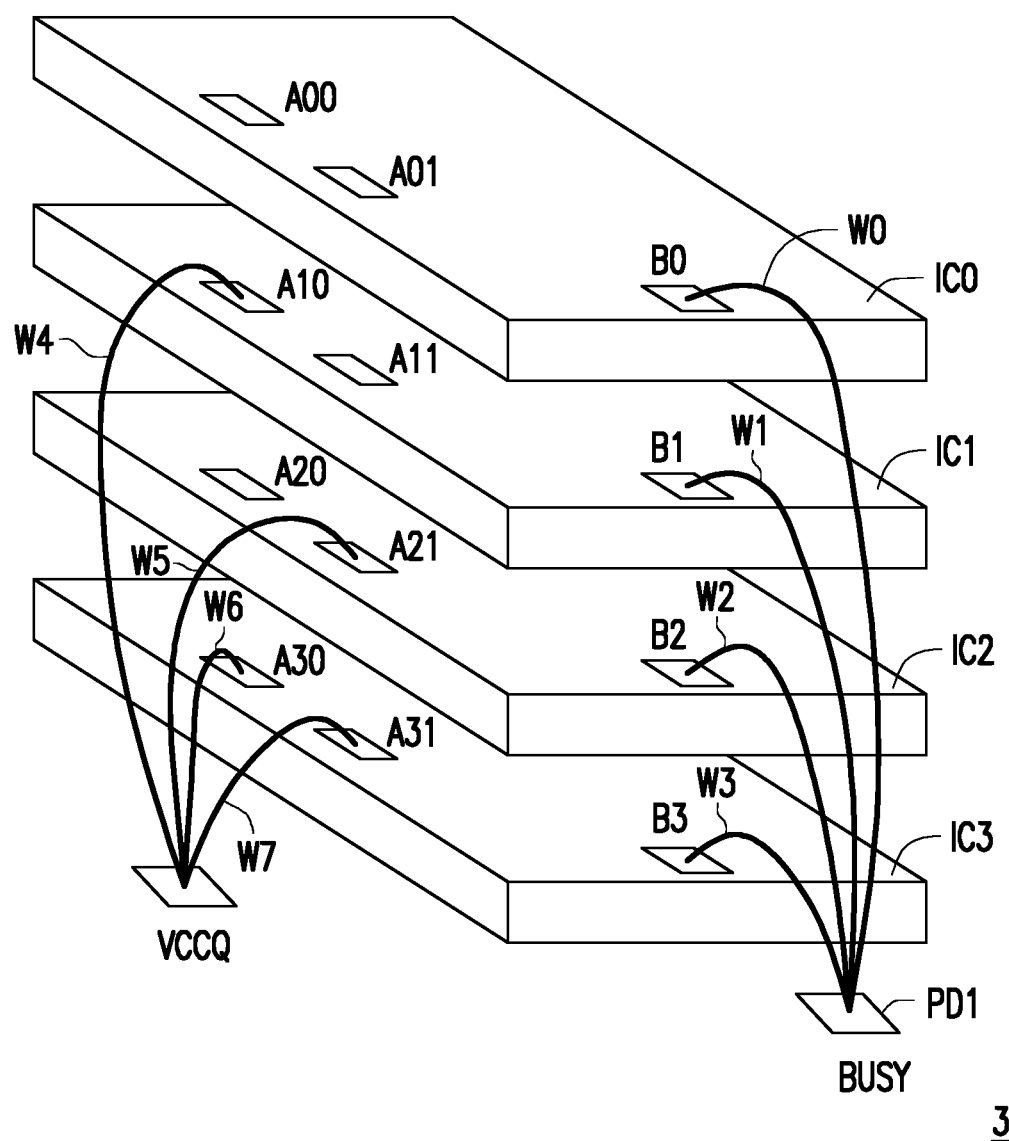
FIG. 3 is a schematic diagram of an integrated circuit according to still another embodiment of the invention.

FIG. 3 is a schematic diagram of an integrated circuit according to still another embodiment of the invention. The integrated circuit 300 includes chips IC0, IC1, IC2 and IC3. The chip IC0 has the stack status pin (including the sub-pins A00 and A01) and the busy pin B0; the chip IC1 has the stack status pin (including the sub-pins A10 and A11) and the busy pin B1; the chip IC2 has a stack status pin (including sub-pins A20 and A21) and a busy pin B2; and the chip IC3 has a stack status pin (including sub-pins A30 and A31) and a busy pin B3.

In order to distinguish the stack positions of the chips IC0, IC1, IC2 and IC3, the sub-pins A00 and A01 of the chip IC0 are all in the floating status; the sub-pin A10 of the chip IC1 is coupled to the reference voltage VCCQ through a wire W4, and the sub-pin A11 of the chip IC1 is in the floating status; the sub-pin A21 of the chip IC2 is coupled to the reference voltage VCCQ through a wire W5, and the sub-pin A20 of the chip IC2 is in the floating status; the sub-pins A30 and A31 of the chip IC3 are respectively coupled to the reference voltage VCCQ through wires W6 and W7.

On the other hand, the chips IC0, IC1, IC2 and IC3 respectively have the busy pins B0, B1, B2 and B3 respectively connected to the pad PD1 through wires W0, W1, W2 and W3, and the indication voltage BUSY is generated on the pad PD1. In the embodiment, the chip IC0 may continuously provide a first bias voltage on the busy pin B0 according to the sub-pins A00 and A01 with the voltage status of the floating status during the initial status setting time section, and the chips IC1, IC2 and IC3 respectively and continuously provide a second bias voltage on the busy pin B1, B2 and B3 according to the sub-pins A10, A11, A20, A21, A30 and A31 with at least one of the voltage statuses thereof being the non-floating status during the initial status setting time section. When the driving capability of the second bias voltage provided by the chips IC1, IC2 and IC3 is greater than the driving capability of the first bias voltage provided by the chip IC0, the voltage value of the indication voltage BUSY is biased to the second bias voltage. For example, the second bias voltage is equal to a power voltage VDD, and the first bias voltage is equal to a ground voltage (0V), when the driving capability of the second bias voltage provided by the chips IC1, IC2 and IC3 is twice of the driving capability of the first bias voltage provided by the chip IC0, by determining that the voltage value of the indication voltage BUSY is substantially equal to $^{11}/_{12}$ VDD, the chips IC0-IC3 may all obtain that there are four chips IC0-IC3 stacked with each other in the integrated circuit 100. Moreover, if the detected indication voltage is substantially equal to $^{3}/_{4}$ VDD, the chips IC0-IC1 may all obtain that there are two chips IC0-IC1 stacked with each other in the integrated circuit 100. Moreover, if the detected indication voltage is substantially equal to 0 volt, the chip IC0 may obtain that the integrated circuit 100 only includes one chip IC0. In this way, by determining the voltage value of the indication voltage, the number of the mutually stacked chips in the integrated circuit 100 is obtained.

Figure 4:
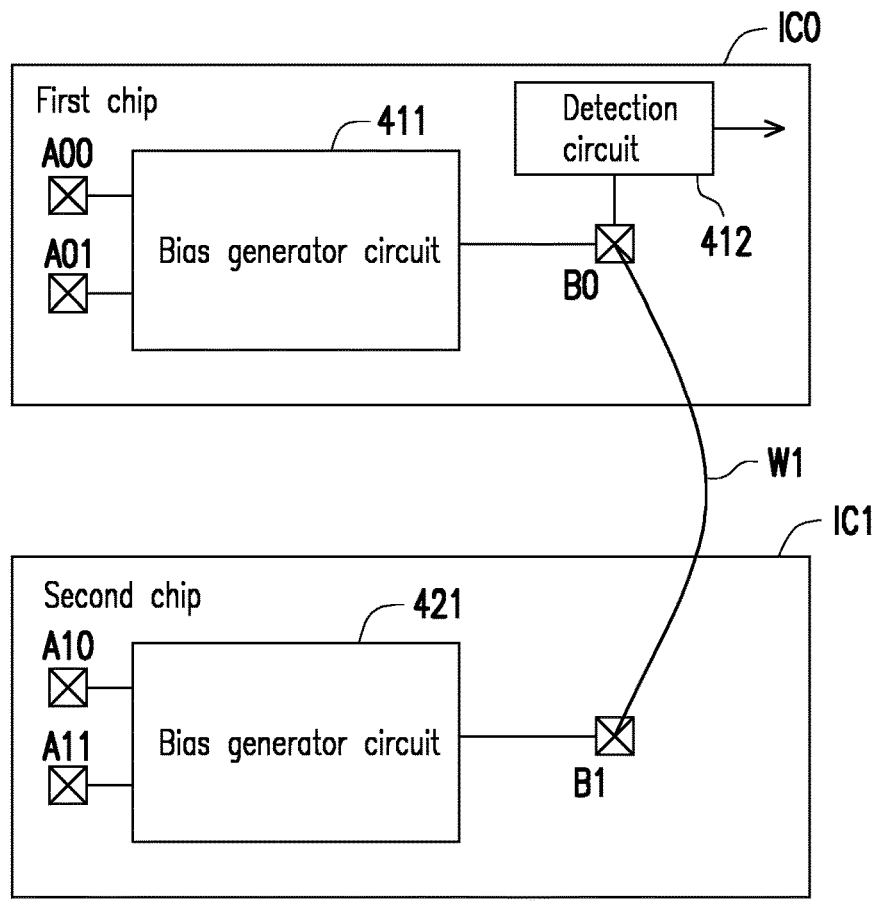
FIG. 4 is a schematic diagram of an implementation detail of an integrated circuit according to an embodiment of the invention.

FIG. 4 is a schematic diagram of an implementation detail of an integrated circuit according to an embodiment of the invention. The integrated circuit 400 includes the first chip IC0 and the second chip IC1. The first chip IC0 includes a bias generator circuit 411 and a detection circuit 412. The bias generator circuit 411 is coupled to the stack status pin (including the sub-pins A00 and A01), and is coupled to the busy pin B0. The bias generator circuit 411 detects voltage statuses of the sub-pins A00 and A01, and applies a first bias voltage or a second bias voltage on the busy pin B0 according to the voltage statuses of the sub-pins A00 and A01. When the voltage statuses of the sub-pins A00 and A01 are all the floating status, the bias generator circuit 411 may apply the first bias voltage on the busy pin B0. When the voltage status of at least one of the sub-pins A00 and A01 is the non-floating status, the bias generator circuit 411 may apply the second bias voltage on the busy pin B0.

On the other hand, the second chip IC1 includes a bias generator circuit 421. The bias generator circuit 421 is coupled to the sub-pins A10 and A11 and the busy pin B1. The bias generator circuit 421 has the same function with that of the bias generator circuit 411, and may apply the first bias voltage or the second bias voltage on the busy pin B1 according to the voltage statuses of the sub-pins A10 and A11.

The detection circuit 412 is coupled to the busy pin B0, where the busy pins B0 and B1 are connected with each other through the wire W1. During the initial status setting time section, the bias generator circuit 411 and the bias generator circuit 421 respectively apply different bias voltages on the busy pins B0 and B1 to pull each other to generate the indication voltage. Meanwhile, the detection circuit 412 may determine whether the integrated circuit 400 includes multiple chips stacked with each other by comparing the indication voltage and the reference voltage. For example, when the indication voltage is greater than the reference voltage, it is determined that the integrated circuit 400 includes multiple chips stacked with each other, and when the indication voltage is smaller than the reference voltage, it is determined that the integrated circuit 400 includes only one chip. Moreover, the detection circuit 412 may obtain the number of the chips stacked with each other in the integrated circuit 400 by determining a magnitude of the voltage value of the indication voltage.

A circuit the same with the detection circuit 412 may also be configured in the second chip IC1, which is used for detecting the indication voltage on the busy pin B1 when the voltage statuses of the sub-pins A10 and A11 are all the floating status. Comparatively, when the voltage statuses of the sub-pins A10 and A11 are not all the floating status, the second chip IC1 may obtain a position of the second chip IC1 in the stacked chips by determining the voltage statuses of the sub-pins A10 and A11. For example, the integrated circuit has four chips stacked with each other, when the sub-pin A10 is not in the floating status, and the sub-pin A11 is in the floating status, the second chip IC1 may be located at a second position directly adjacent to the first chip IC0. When the sub-pin A10 is in the floating status, and the sub-pin A11 is not in the floating status, the second chip IC1 may be located at a third position that is relatively away from the first chip IC0. When the sub-pin A10 and the sub-pin A11 are all not in the floating status, the second chip IC1 may be located at a fourth position that is most away from the first chip IC0.

Certainly, the relationship between the voltage statuses of the stack status pins and the configuration positions of the chips is not particularly specified, and the above descriptions are only used for explaining examples, and are not particularly specified.

Figure 5:
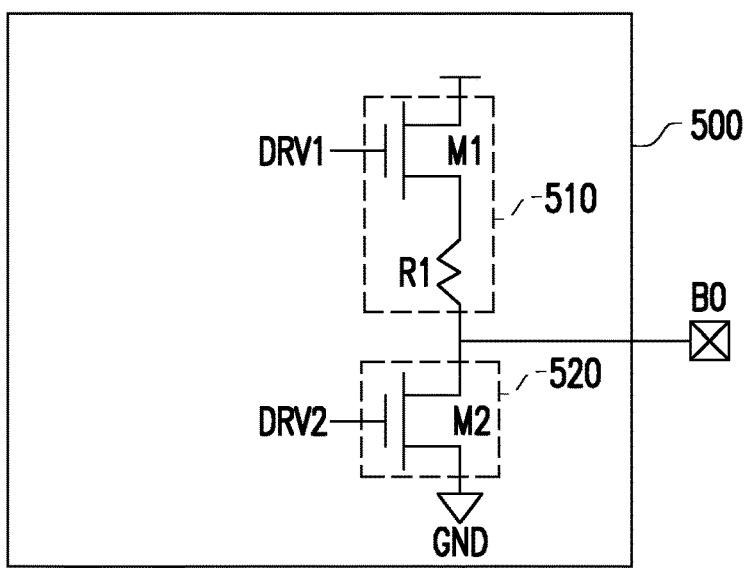
FIG. 5 is a schematic diagram of an implementation of a bias generation circuit according to an embodiment of the invention.

FIG. 5 is a schematic diagram of an implementation of a bias generation circuit according to an embodiment of the invention. The bias generation circuit 500 may include a first circuit 510 and a second circuit 520. When the bias generation circuit 500 is about to apply the first bias voltage on the busy pin B0, the bias generation circuit 500 may turn on a transistor M1 in the first transistor 510 through a driving signal DRV1, and the transistor M1 provides the first bias voltage to the busy pin B0 through a resistor R1. Comparatively, when the bias generation circuit 500 is about to apply the second bias voltage on the busy pin B0, the bias generation circuit 500 may turn on a transistor M2 in the second transistor 520 through a driving signal DRV2, and the transistor M2 directly provides the second bias voltage to the busy pin B0.

Based on the effect of the resistor R1, the driving capability of the first bias voltage provided by the bias generation circuit 500 may be lower than the driving capability of the second bias voltage.

The implementation of FIG. 5 is only an example, and those skilled in the art may design to generate the bias voltages of different voltage values according to different driving capabilities under different conditions by using any method. For example, the driving capability of the generated bias voltage may all be adjusted by changing the transistor M1 to a long channel type transistor, or increasing a channel width-to-length ratio of the transistor M2.

Figure 6:
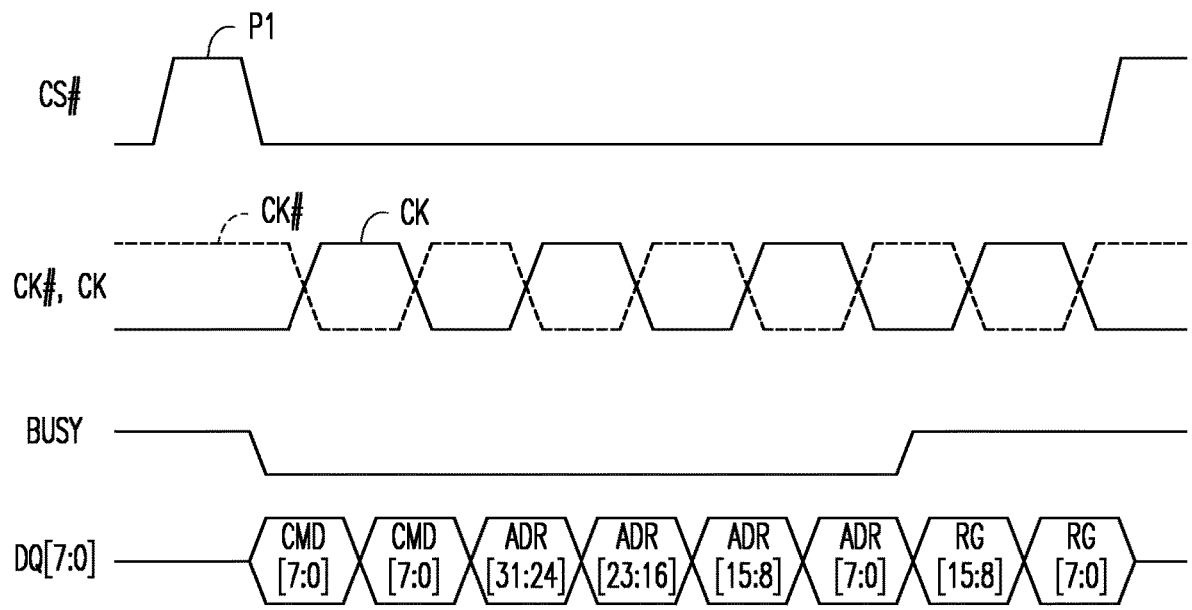
FIG. 6 is a waveform diagram of a detection operation for multi-chip status according to an embodiment of the invention.

FIG. 6 is a waveform diagram of a detection operation for multi-chip status according to an embodiment of the invention. The integrated circuit executes an operation according to a signal CS#, and executes an access operation on the memory in the integrated circuit according to a clock signal CK and an inverted clock signal CK# after a pulse P1 provided by the signal CS#. During a time section TT1, an external host may use a data signal DQ[7:0] to sequentially transmit a command CMD[7:0] and addresses ADR[31:24], ADR[23:16], ADR[15:8] and ADR[7:0] to the chips of the integrated circuit. Moreover, during a time section TT2, the external host uses the data signal DQ[7:0] to transmit writing data RG[15:8] and RG[7:0] to the chip (for example, the memory) of the integrated circuit.

On the other hand, the chips in the integrated circuit may drive the indication voltage BUSY on the busy pin, so that the indication voltage BUSY has a voltage level. By detecting the voltage level of the indication voltage BUSY, a chip stack status in the integrated circuit is known. For example, when the integrated circuit has a plurality of stacked chips, the first chip therein may temporarily provide the first bias voltage to pull down the indication voltage BUSY according to the stack status pins all in the floating status during a specific time section. Moreover, the second chip may continuously provide the second bias voltage to pull high the indication voltage BUSY. When the voltage level of the indication voltage BUSY is in a high voltage level status, the integrated circuit has a plurality of chips stacked with each other. Comparatively, when the voltage level of the indication voltage BUSY is in a low voltage level status, the integrated circuit has a single chip.

Figure 7:
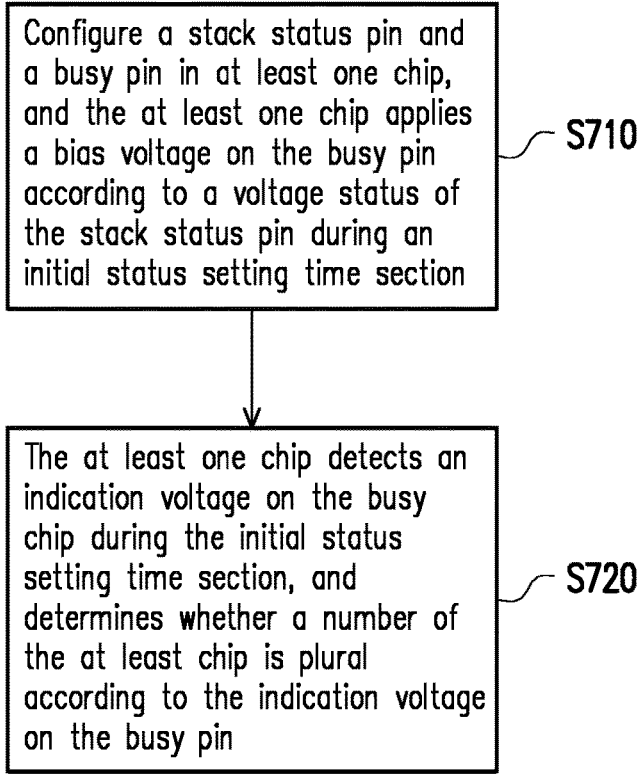
FIG. 7 is a flowchart illustrating a detection method for multi-chip status according to an embodiment of the invention.

FIG. 7 is a flowchart illustrating a detection method for multi-chip status according to an embodiment of the invention. In step S710, a stack status pin and a busy pin are configured in at least one chip, and the at least one chip applies a bias voltage on the busy pin according to a voltage status of the stack status pin during an initial status setting time section. In step S720, the at least one chip detects an indication voltage on the busy chip during the initial status setting time section, and determines whether the number of the at least chip is plural according to the indication voltage on the busy pin.

Implementation details of the above steps have been described in the aforementioned embodiments and implementations, and details thereof are not repeated.

In summary, the at least one chip applies different bias voltages on the busy pin according to the voltage status of the stack status pin thereof. Moreover, by detecting the voltage value of the indication voltage on the busy pin, it is effectively determined whether the number of the at least one chip included in the integrated circuit is plural, and by detecting the voltage status of the stack status pin, the position of the chip in the stack is effectively determined.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An integrated circuit, comprising:
at least one chip, having a stack status pin and a busy pin, wherein the at least one chip applies a bias voltage on the busy pin according to a voltage status of the stack status pin, and the at least one chip detects an indication voltage on the busy pin, and determines whether a number of the at least chip is plural according to the indication voltage on the busy pin.

2. The integrated circuit as claimed in claim 1, wherein the at least one chip compares the indication voltage with a reference voltage to determine whether the number of the at least one chip is plural, when the indication voltage is greater than the reference voltage, the number of the at least one chip is plural, and when the indication voltage is smaller than the reference voltage, the number of the at least one chip is one.

3. The integrated circuit as claimed in claim 1, wherein the at least one chip applies the bias voltage on the busy pin according to the voltage status of the stack status pin during an initial status setting time section.

4. The integrated circuit as claimed in claim 1, wherein the at least one chip comprises:
   a first chip, having a first stack status pin and a first busy pin, and applying a first bias voltage on the first busy pin according to a voltage status of the first stack status pin; and
   a second chip, having a second stack status pin and a second busy pin, and applying a second bias voltage on the second busy pin according to a voltage status of the second stack status pin, wherein the first busy pin and the second busy pin are coupled to each other.

5. The integrated circuit as claimed in claim 4, wherein the first stack status pin is in a floating status, and the first chip applies the first bias voltage on the first busy pin, wherein the second stack status pin has a plurality of sub-pins, at least one of the sub-pins is in a non-floating status, and the second chip applies the second bias voltage on the second busy pin, and voltages values of the first bias voltage and the second bias voltage are different.

6. The integrated circuit as claimed in claim 4, wherein driving capability of the first bias voltage is different to driving capability of the second bias voltage.

7. The integrated circuit as claimed in claim 1, wherein the at least one chip obtains a stack position of the at least one chip according to the voltage status of the stack status pin.

8. The integrated circuit as claimed in claim 1, wherein the at least one chip comprises:
   a bias generation circuit, coupled to the stack status pin and the busy pin, and applying the bias voltage on the busy pin according to the voltage status of the stack status pin.

9. The integrated circuit as claimed in claim 1, wherein the at least one chip comprises:
   a detection circuit, coupled to the busy pin, and determining whether the number of the at least one chip is plural according to the indication voltage.

10. A detection method for multi-chip status, comprising:
    configuring a stack status pin and a busy pin in at least one chip, and applying a bias voltage on the busy pin according to a voltage status of the stack status pin; and
    detecting an indication voltage on the busy pin by the at least one chip, and determining whether a number of the at least chip is plural according to the indication voltage on the busy pin.

11. The detection method for multi-chip status as claimed in claim 10, wherein the at least one chip compares the indication voltage with a reference voltage to determine whether the number of the at least one chip is plural, wherein when the indication voltage is greater than the reference voltage, the number of the at least one chip is plural, and when the indication voltage is smaller than the reference voltage, the number of the at least one chip is one.

12. The detection method for multi-chip status as claimed in claim 10, wherein the step of applying the bias voltage on the busy pin according to the voltage status of the stack status pin comprises:
    applying the bias voltage on the busy pin according to the voltage status of the stack status pin during an initial status setting time section.

13. The detection method for multi-chip status as claimed in claim 10, wherein the at least one chip comprises a first chip and at least one second chip, and the step of applying the bias voltage on the busy pin according to the voltage status of the stack status pin comprises:
    applying a first bias voltage on a first busy pin by the first chip according to a voltage status of a first stack status pin; and
    applying a second bias voltage on a second busy pin by the at least one second chip according to a voltage status of a second stack status pin, wherein the first busy pin and the second busy pin are coupled to each other.

14. The detection method for multi-chip status as claimed in claim 13, wherein the step of applying the first bias voltage on the first busy pin by the first chip according to the voltage status of the first stack status pin comprises:
    the first stack status pin being in a floating status, and applying the first bias voltage on the first busy pin by the first chip; and
    the step of applying the second bias voltage on the second busy pin by the at least one second chip according to the voltage status of the second stack status pin comprises:
    at least one of sub-pins of the at least one second chip being in a non-floating status, and applying the second bias voltage on the second busy pin by the at least one second chip,
    wherein voltages values of the first bias voltage and the second bias voltage are different.

15. The detection method for multi-chip status as claimed in claim 13, wherein driving capability of the first bias voltage is different to driving capability of the second bias voltage.

* * * * *